United States Patent
Fiaccabrino et al.

(10) Patent No.: US 9,250,533 B2
(45) Date of Patent: Feb. 2, 2016

(54) METHOD OF FABRICATING MULTI-LEVEL METALLIC PARTS BY THE LIGA-UV TECHNIQUE

(75) Inventors: Jean-Charles Fiaccabrino, Grandevent (CH); Gilles Rey-Mermet, Monthey (CH)

(73) Assignee: Nivarox-FAR S.A., Le Locle (CH)

( * ) Notice: Subject to any disclaimer, the term of this patent is extended or adjusted under 35 U.S.C. 154(b) by 1258 days.

(21) Appl. No.: 13/060,203

(22) PCT Filed: Jul. 23, 2009

(86) PCT No.: PCT/EP2009/059476
§ 371 (c)(1),
(2), (4) Date: Feb. 22, 2011

(87) PCT Pub. No.: WO2010/020515
PCT Pub. Date: Feb. 25, 2010

(65) Prior Publication Data
US 2011/0146070 A1    Jun. 23, 2011

(30) Foreign Application Priority Data
Aug. 20, 2008  (EP) ..................................... 08162693

(51) Int. Cl.
*H05K 3/02* (2006.01)
*H05K 3/10* (2006.01)
(Continued)

(52) U.S. Cl.
CPC . *G03F 7/405* (2013.01); *C23C 2/02* (2013.01); *C23C 2/26* (2013.01); *C25D 1/003* (2013.01);
(Continued)

(58) Field of Classification Search
CPC ... H05K 3/0023; H05K 3/4661; H05K 3/185; C23C 2/02; C23C 2/26; C23C 10/04; C25D 1/00; C25D 5/022; C25D 5/10; G03F 7/0035; Y10T 29/49155; Y10T 29/49146

USPC ............ 29/825, 846, 874, 885; 148/518, 533; 427/304, 305, 468, 510
See application file for complete search history.

(56) References Cited

U.S. PATENT DOCUMENTS

| | | | |
|---|---|---|---|
| 4,058,401 A | 11/1977 | Crivello | |
| 5,149,615 A * | 9/1992 | Chakravorty et al. | 430/313 |
| 5,529,681 A * | 6/1996 | Reinecke et al. | 205/70 |
| 5,792,594 A | 8/1998 | Brown et al. | |
| 2009/0081476 A1 | 3/2009 | Saucy | |

FOREIGN PATENT DOCUMENTS

| | | |
|---|---|---|
| EP | 0 851 295 | 7/1998 |
| EP | 1 225 477 A1 | 7/2002 |
| EP | 1 835 050 | 9/2007 |

OTHER PUBLICATIONS

Search Report issued in the corresponding International application PCT/EP2009/059476.
(Continued)

*Primary Examiner* — Peter DungBa Vo
*Assistant Examiner* — Jeffrey T Carley
(74) *Attorney, Agent, or Firm* — Oblon, McClelland, Maier & Neustadt, L.L.P.

(57) ABSTRACT

The method of fabricating a multi-level, metallic microstructure includes the steps consisting in structuring a first layer of photosensitive resin so as to obtain a first level of a resin mould, the aperture in the first resin layer revealing a conductive surface of a substrate, structuring a second photosensitive resin layer over the first level of a resin mould so as to obtain a multi-level resin mould, the apertures in the multi-level mould revealing the conductive surface of the substrate, galvanically depositing a metal or alloy in the apertures of the multi-level resin mould and separating a multi-level metallic structure formed by the metal or alloy deposited in the apertures from the substrate and the multi-level resin mould.

9 Claims, 3 Drawing Sheets

(51) Int. Cl.
  *G03F 7/40*    (2006.01)
  *C23C 2/02*    (2006.01)
  *C23C 2/26*    (2006.01)
  *C25D 5/02*    (2006.01)
  *C25D 5/10*    (2006.01)
  *G03F 7/00*    (2006.01)
  *C25D 1/00*    (2006.01)
  *C25D 5/56*    (2006.01)

(52) U.S. Cl.
  CPC    *C25D 5/022* (2013.01); *C25D 5/10* (2013.01);
          *G03F 7/0035* (2013.01); *C25D 5/56* (2013.01);
          *Y10T 29/49155* (2015.01)

(56) References Cited

OTHER PUBLICATIONS

A. B. Frazier et al., "Metallic Microstructures Fabricated Using Photosensitive Polyimide Electroplating Molds" published in the Journal of Microelectromechanical Systems (vol. 2, No. 2, Jun. 1993), pp. 87-94.

George Dibari. "Electroforming" Electroplating Engineering Handbook, 4th Edition, under the direction of L J. Durney, published by Van Nostrand Reinhold Company Inc., N.Y., USA 1984, pp. 474-490.

* cited by examiner

METHOD OF FABRICATING MULTI-LEVEL METALLIC PARTS BY THE LIGA-UV TECHNIQUE

This is a National Phase Application in the United States of International Patent Application PCT/EP2009/059476 filed Jul. 23, 2009, which claims priority on European Patent Application No. 08162693.9 of Aug. 20, 2008. The entire disclosures of the above patent applications are hereby incorporated by reference.

FIELD OF THE INVENTION

The present invention concerns a method of fabricating a multi-level metal structure by a UV photolithographic and galvanic deposition technique.

BACKGROUND OF THE INVENTION

Methods that correspond to the above definition are already known. In particular, the article by A. B. Frazier et al. entitled "Metallic Microstructures Fabricated Using Photosensitive Polyimide Electroplating Molds" published in the Journal of Microelectromechanical Systems (Vol. 2, N deg. 2, June 1993) describes a method of fabricating multi-level metallic structures by galvanic growth in polyimide moulds made by the photolithography of photosensitive resin layers. This method includes the following steps:
  creating a sacrificial metallic layer and a priming layer on a substrate for subsequent galvanic growth,
  spreading out a layer of photosensitive polyimide,
  irradiating the polyimide layer with UV radiation through a mask that matches the contour of one level of the structure to be formed,
  developing the polyimide layer by dissolving the non-irradiated parts so as to obtain a polyimide mould,
  filling the mould with nickel to the height of the mould by galvanic growth, and obtaining an approximately flat top surface,
  depositing a thin layer of chromium over the entire top surface by vacuum plating,
  depositing a new layer of photosensitive resin on the chromium layer,
  irradiating the resin layer through a new mask that matches the contour of the next level of the structure to be obtained,
  developing the polyimide layer so as to obtain a new mould,
  filling the new mould with nickel to the height of the mould by galvanic growth,
  separating the multi-level structure and the polyimide mould from the sacrificial layer and the substrate,
  separating the multi-level structure from the polyimide mould.

It will be clear that the method that has just been described may, in theory, be repeatedly implemented to obtain metallic structures that have more than two levels. One drawback of this method is the necessity of obtaining an approximately flat top surface during each galvanic deposition step. One solution to this problem is disclosed in EP Patent No. 1,835,050, which teaches that it is possible to obtain the desired flat surface by machining the metallic structure and the mould in situ after the galvanic deposition step. However, the presence of in a clean room machining installations could potentially create more problems than it solves. The alternative, which consists in making return trips between a machining installation and the clean room, is also incompatible with the extreme cleanliness generally necessary for photolithography and galvanic deposition.

EP Patent No. 0,851,295 discloses another method for fabricating multi-level metallic structures in moulds made by UV photolithography. This second method includes the following steps:
  a) creating a sacrificial metallic layer on a substrate,
  b) spreading out a layer of photosensitive epoxy resin with a thickness of between 150 and 700 microns,
  c) pre-baking said layer at a temperature between 90° and 95° for a duration that depends upon the deposited thickness,
  d) irradiating the resin layer with UV radiation through a mask that matches the contour of one level of the structure to be obtained,
  e) post-baking said layer to cause polymerisation
  f) reproducing steps b) to e) at least once, and if required, depending upon the desired contour for structuring the new layer of photoresist, using a different mask for step d),
  g) developing the superposed resin layers by dissolving the non-irradiated parts so as to obtain an epoxy resin mould,
  ii) forming a primary metallisation over the entire surface of the mould, then completely covering the mould by galvanic depositions so as to form the multi-level metallic structure,
  h) separating the substrate from the assembly formed by the epoxy resin mould and the metallic structure,
  iii) separating the multi-level structure from the resin mould.

One advantage of this second method is that the resin mould is completely made prior to the galvanic deposition step. Any machining of the multi-level metallic structure can thus be performed afterwards, outside the clean room, without any risk of contaminating the latter. However, this second method also has some drawbacks. In particular, the superposed resin layers are developed during the same step. In these conditions, the prebake step of the second photoresist layer necessarily also constitutes a post bake of the first layer. It is thus very difficult to adapt the temperature and the duration of the bakes in an optimum manner.

SUMMARY OF THE INVENTION

It is therefore an object of the present invention to provide a method of fabricating a multi-level metallic structure via UV photolithographic and galvanic deposition techniques, which overcomes the aforementioned drawbacks of the prior art. The present invention achieves this object by providing a method of fabricating a multi-layered metallic microstructure by UV photolithography and galvanic deposition, characterized in that it includes the steps of:
  a) providing a substrate that has a conductive surface;
  b) covering the conductive surface of the substrate with a first layer of photosensitive resin;
  c) irradiating the first layer of photosensitive resin through a mask that matches the desired pattern cavity;
  d) developing the first layer of photosensitive resin so as to hollow out apertures therein and thus obtain a first level of a resin mould, the aperture in the first resin layer revealing the conductive surface of the substrate;
  e) depositing a new layer of photosensitive resin over the developed resin layer, so as to cover the latter and, preferably, to fill the apertures therein;

f) irradiating the new photosensitive resin layer through a mask that matches the desired pattern cavity;

g) developing the new photosensitive resin layer so as to hollow out apertures therein and to obtain a multi-level resin mould, the apertures in the multi-level mould revealing the conductive surface of the substrate;

h) passing directly to step i) or, if desired, first of all repeating steps e) to g) of the method to add an additional layer to the multi-level mould;

i) galvanically depositing a metal or an alloy in the apertures of the multi-level resin mould;

j) separating the substrate, then removing the resin layers so as to reveal a multi-layer metallic structure formed by said metal or alloy deposited in the apertures.

It will be clear that, as with the second method of the prior art, according to the present invention the multi-level metallic part is formed in a single galvanic growth step (step J). However, according to the invention, the various resin layers forming the photoresist mould are developed separately one after the other. It is thus possible to adapt the temperature and duration separately for the pre-bake of a top layer and the post-bake of the bottom layer.

Another advantage of the method according to the present invention is that it allows common side walls to be obtained on two levels, which is not possible with the first method described above.

Yet another advantage of the present invention is that, unlike the second method of the prior art described above, it offers the possibility of using photosensitive resins of different natures for the different levels. One may, for example, envisage using a negative photoresist for the first level and a positive photoresist for the second level. This possibility makes it easier to make certain structures that have complex shapes.

According to a first implementation variant, after step d), the method includes the step of forming a conductive surface on the remaining parts of the resin layer developed in the preceding step.

Alternatively, according to a second variant, the step of forming a pierced, conductive surface on the first, photosensitive resin layer can be placed between step b) and step c) or between step c) and step d). According to yet another variant, the conductive layer may be formed between step g) and step h), once the photoresist moulds have been made.

BRIEF DESCRIPTION OF THE DRAWINGS

Other features and advantages of the method according to the present invention will appear upon reading the following description, given solely by way of non-limiting example, with reference to the annexed drawings, in which.

DETAILED DESCRIPTION OF THE INVENTION

Figure 1:
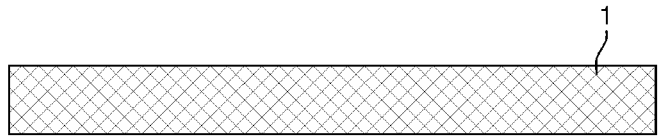
FIGS. 1 to 13 illustrate various steps of the method corresponding to a particular implementation of the method of the invention.
Figure 2:
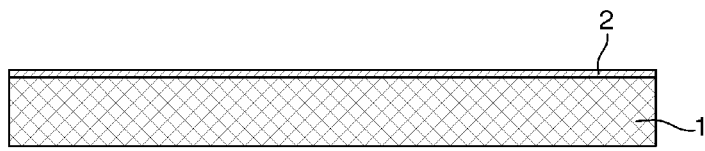

According to the present invention, the method includes the step of taking a substrate that has a conductive surface. In the particular implementation illustrated in the Figures, substrate 1 is formed by a silicon, glass or ceramic wafer (FIG. 1) on which a conductive layer 2 has been vapour-deposited (FIG. 2) beforehand. This conductive layer 2 is used as a priming layer, i.e. as a cathode, during a subsequent galvanic deposition. Typically, priming layer 2 can be formed of an underlayer of chromium or titanium covered with a gold or copper layer.

According to a variant that is not shown, prior to depositing priming layer 2, a sacrificial layer, which may, for example, be made of aluminium, is first of all vacuum plated on the substrate. The thickness of this layer is typically of the order of a tenth of a micron, and it is for enabling the multi-level metallic structure to be separated from the substrate at the end of the method. According to yet another variant, the same metallisation layer can fulfil the dual function of sacrificial layer and priming layer. Moreover, instead of vacuum plating, it is possible to use galvanic deposition as a technique for forming a sacrificial layer.

Alternatively, the substrate can be formed by a stainless steel plate or another metal. It will be clear that, in these conditions, it is not necessary to deposit a conductive layer. However, the priming surface will generally have to be cleaned before use.

Figure 3:
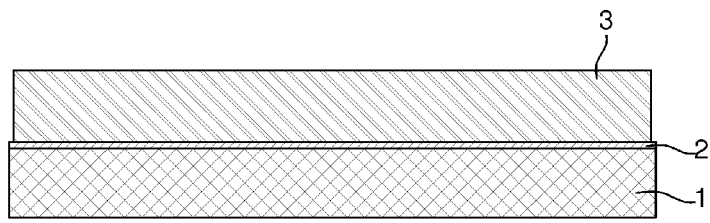

The next step (FIG. 3) consists in covering the conductive surface of the substrate with a first, photosensitive resin layer. The resin used is preferably an octofunctional epoxy based resin available from Shell Chemical under the reference SU-8. This resin also includes a photoinitiator selected from among triarylsulfonium salts such as those described in U.S. Pat. No. 4,058,401. This resin forms a negative photoresist, which is designed to polymerise via the action of UV radiation.

Alternatively, the photosensitive resin could be a positive photoresist, which is designed to break down via the action of UV radiation. It will be clear that the present invention is not limited to a few particular types of photosensitive resin. Those skilled in the art will know how to choose a photosensitive resin that suits their requirements amongst all the known resins that are suited to UV photolithography.

Resin 3 can be deposited on priming layer 2 using any technique known to those skilled in the art, for example, spin coating, by cylinder application or even by lamination for a "solid" resin, etc. The thickness of photosensitive resin layer 3 is typically between 150 and 600 microns. Depending upon the thickness and technique used, the resin could be deposited in one or several steps.

According to the particular implementation of the invention that forms the subject of the present invention, after step b), resin layer 3 is pre-baked again between 90 and 95° C. for a sufficient time to evaporate the solvents. It will be clear however to those skilled in the art that, depending upon the nature of the resin used, this pre-bake step is not necessarily required.

Figure 4:
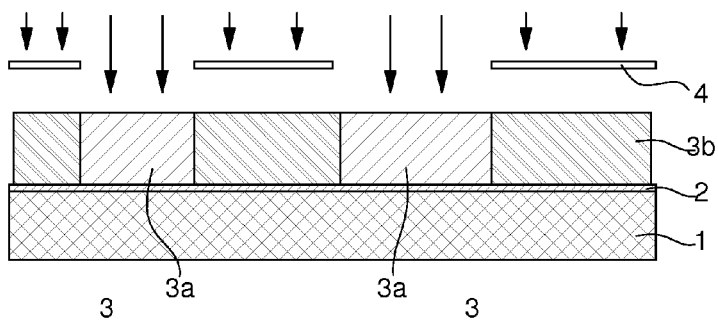

The next step of the method (FIG. 4) consists in irradiating the resin layer by means of UV radiation through the apertures of a mask 4 that defines the contours of the first level of the desired microstructure. This UV irradiation may, for example, be made by means of an aligner (not shown) with peaks of intensity at 365 and 410 nm. The irradiation amplitude depends upon the thickness of the resin. It is typically between 200 and 1,000 mJ/cm$^3$ measured at a wavelength of 365 nm. If necessary, a post-bake step may be required to complete the polymerisation induced by UV radiation. With a negative photoresist like that used in this example, the post-bake step is preferably performed at between 90 and 95° C. for 15 to 30 minutes. The isolated (photopolymerised) zones 3a thus become insensitive to a large majority of development liquids. However, the non-insulated zones 3b could subsequently be dissolved using a suitable development liquid.

Figure 5:

The next step of the method (FIG. 5) consists in developing the photosensitive resin layer 3. In this example, the photoresist used is negative. In these conditions, developing the photoresist means chemically etching the resin, so as to dissolve non-insulated zones 3b, and exposing conductive layer 2 of substrate 1 in places. It will be clear, however, that in the case of a positive photoresist, it is insulated zones 3a that are dissolved. Those skilled in the art will know how to choose a suitable development liquid for the photoresist development step on the basis of the photosensitive resin manufacturer's instructions. According to an advantageous variant, it is possible to perfect that development step via brief exposure to a plasma so as to clean the resin mould properly and activate the surface thereof in preparation for the following step.

The next step of the method (FIG. 6) consists in making the remaining parts of the resin layer surface, which was developed in the preceding step, conductive. In order to do this, a metallisation layer 5 is deposited, for example by vacuum plating.

Figure 6:
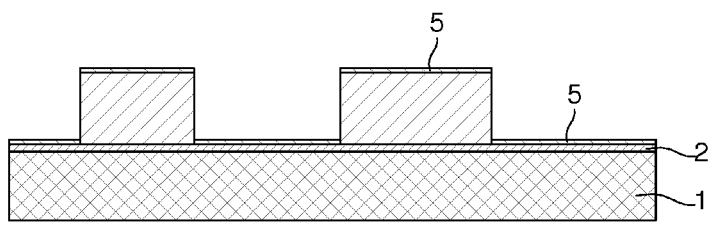

FIG. 6 shows that metallisation layer 5 preferably only covers the horizontal surfaces, such that the side walls remain insulating. However, the parts of conductive surface 2 that were exposed in the preceding step cannot be covered by conductive layer 5 without this damaging the method. Moreover, according to a variant that is not shown, the metallisation could be made on the vertical surfaces as well as on the horizontal surfaces.

Further, those skilled in the art will not have any particular difficulty in choosing a metal to evaporate that can stick to the photoresist, or in choosing a metal that can be used as priming layer 5 for a subsequent galvanic deposition. Chromium, for example, can fulfil both conditions. Further, there are photoresists that are naturally conductive. It will be clear that in this particular case, performing the surface metallisation is not necessarily required.

According to the above description, in the implementation forming the subject of this example, the conductive surface 5 is formed on the photosensitive resin layer after step d) of the method.

Alternatively, according to a second variant, the step of forming a conductive surface on the first photosensitive resin layer may be placed between step b) and step c) or between step c) and step d). In the case of deposition after step b), conductive surface 5 is then either pierced after being deposited, or it is deposited directly in said predetermined piercing so as to make step c) possible in accordance with the above explanation, or in order for conductive surface 5 to be used as the actual mask 4. In this latter case, it is thus clear that resin 3 must necessarily be a positive resin.

In the case of deposition after step c), conductive surface 5 is then either pierced after being deposited, or deposited directly in accordance with said piercing matching the piercing of mask 4 so as to make step d) possible in accordance with the above explanation. It is clear therefore that if conductive surface 5 is deposited after step b) or c), it will only be present over the top of first resin 3 and not also on one part of conductive surface 2 as illustrated in FIG. 6.

According to yet another variant, the conductive layer can be formed at the bottom of the apertures between step g) and step h) once the photoresist moulds have been made.

Figure 7:
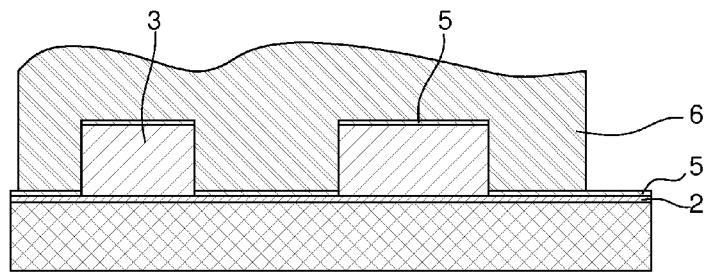

The next step of the method (FIG. 7) consists in depositing a new layer of photosensitive resin 6 on vaporised metal layer 5 so as to cover the latter and fill the apertures in developed resin layer 3. For this step, it is preferable for the apertures formed in the already developed resin layer 3 to be well filled by the resin from new layer 6. When deposition using a spin coater does not give satisfactory results, it is possible to use another deposition technique to make the new photoresist layer. For example, it is possible to spray the surface to be covered with a spray photoresist, like the Ti spray by Microchemicals GmbH, or even to use a conventional positive photoresist that has been diluted beforehand. It is also possible to form the new layer 6 by galvanic deposition of a photoresist such as PEPR 2400 by Shipley Ltd.

Alternatively, it is also possible to apply the photoresist of new layer 6 so as to cover layer 3 without the photoresist penetrating the apertures. To obtain this result, one may for example use a "solid" resin, which can, for example, be made to adhere by lamination.

The next step of the method (FIG. 8) consists in irradiating the new resin layer 6 by means of UV radiation through the apertures of a mask 7 defining the contour of the second level of the desired microstructure. This step requires aligning mask 7 with the first level apertures. Those skilled in the art will know how to achieve this alignment, for example by using alignment marks.

Figure 8:
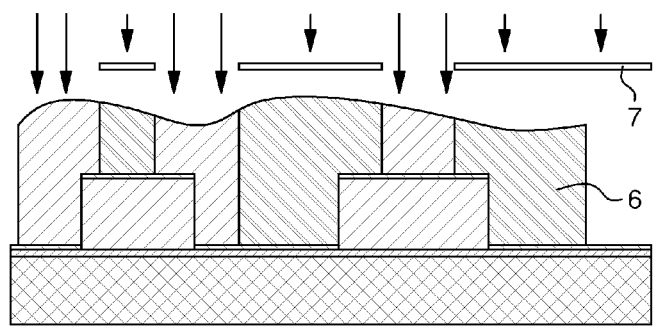

Moreover, FIG. 8 shows that the method according to the invention can make flanks that rise on two levels (or more). As described above, depending upon the nature of the photoresist used, a post-bake step is then performed on the assembly to perfect the polymerisation induced by the UV irradiation.

Figure 9:
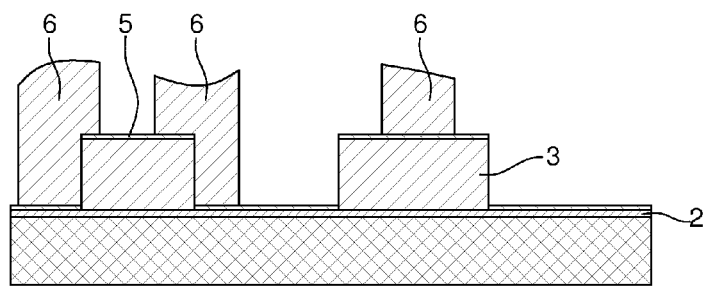

The next step of the method (FIG. 9) consists in developing the new irradiated photosensitive resin layer 6. The technique may be the same as that used to develop the first layer of photoresist. The step of developing resin layer 6 produces a resin mould with two levels. According to a variant, once this step has been performed, it is possible to reproduce the following steps, which correspond to FIGS. 6 to 9, to obtain, if desired, a resin mould with three levels.

Figure 10:
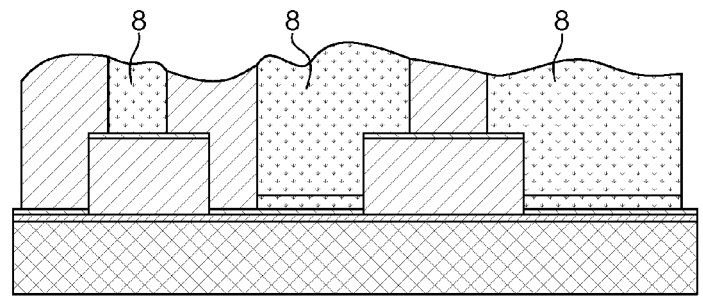

The next step of the method (FIG. 10) consists in galvanically depositing a metal or an alloy in the apertures of the multi-level resin mould. According to an advantageous variant, prior to this step, the surfaces forming the flanks of the resin mould, as well as the metallised horizontal surfaces, are then activated. Activating the surfaces improves the priming and regularity of the galvanic deposition. Typically, the metal used for galvanic deposition will be chosen from among the group that includes nickel, copper, gold and silver, or gold-copper, nickel-cobalt, nickel-iron and nickel-phosphorous. Generally, the multi-layer metallic structure is entirely made of the same alloy or metal. However, it is also possible to change metal or alloy during the galvanic deposition step so as to obtain a metallic structure that includes at least two layers of a different nature. Those skilled in the art will know how to determine the conditions for galvanic deposition, in particular the composition of the bath, system geometry, current voltages and intensity, in accordance with the metal or alloy to be deposited. Reference could be made, for example to Di Bari G. A. "electroforming" Electroplating Engineering Handbook, $4^{th}$ Edition, under the direction of L. J. Durney, published by Van Nostrand Reinhold Company Inc., N.Y., USA 1984.

Referring again to FIG. 9, it can be seen that the apertures in the resin mould do not all have the same depth. Some apertures expose conductive layer 2 of substrate 1, whereas other apertures only extend as far as conductive layer 5, which covers the first level of photosensitive resin 3. In a conventional manner, the galvanic deposition installation is arranged to keep the conductive layer 2 of substrate powered up so that the latter behaves like a cathode. According to the present invention, conductive layer 5, which covers the first photosensitive resin layer, is preferably not connected to the voltage source. Thus, in a first phase, the galvanic deposition is only performed on conductive surface 2. It is only once the electroplated metal layer reaches the height of the first resin layer that it can come into contact with conductive layer 5 and power up said layer. Owing to this feature, the galvanic growth can progress simultaneously in the various apertures, which means that structures with relatively flat surfaces can be made.

Figure 11:
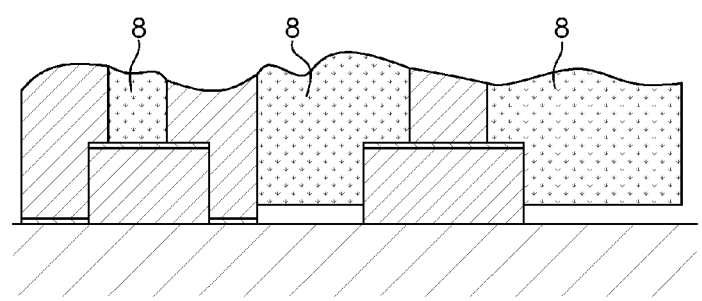

The next step of the method (FIG. 11) consists in separating the assembly formed by the polymerised photoresist and the multi-layer metallic structure obtained in the preceding step from the substrate. If the substrate carries a sacrificial layer formed at the start of the method, as explained above, the multi-level metallic structure is separated by dissolving the sacrificial layer (FIG. 11) (for example using a potassium hydroxide solution (KOH) if the layer is made of aluminium).

Depending upon the materials used, it is possible to separate the multi-level metallic structure and the resin mould simply by delamination, without it being necessary to etch and dissolve a sacrificial layer. This is the case in particular when the substrate is a solid metallic wafer.

Figure 12:
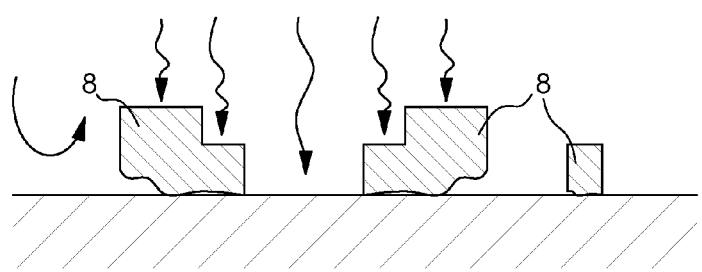

Once the multi-layer metallic structure and photoresist have been detached from the substrate, the next step (FIG. 12) consists in removing the photosensitive resin layers to release the metallic microstructure.

According to a variant that is not shown, the multi-level metallic structure is placed in a bath again to remove the remaining parts of priming layers 2, 5.

Figure 13:
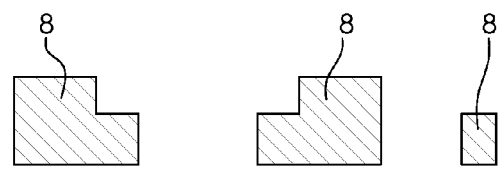

In the example that forms the subject of this description, the method further includes a last step (FIG. 13), which consists in levelling the top part of the multi-layer structure by lapping and polishing techniques.

It will also be clear that various alterations and/or improvements that are obvious to those skilled in the art can be made to the implementation forming the subject of this description without departing from the scope of the present invention, defined by the annexed claims.

The invention claimed is:

1. A method of fabricating a multi-level, metallic microstructure by a UV photolithographic and galvanic deposition technique, wherein it includes the steps of:
 a) providing a top planar substrate that has a conductive surface;
 b) covering the top planar conductive surface with a first layer of photosensitive resin;
 c) irradiating the first layer of photosensitive resin through a mask that matches a desired pattern cavity;
 d) developing the first layer so as to hollow out apertures therein and thus obtain a first level of a resin mould, the apertures in the first resin layer revealing the conductive surface of the top planar substrate;
 e) depositing a second layer of photosensitive resin over the first developed layer of photosensitive resin and the revealed top planar conductive surface of the substrate, so as to cover the first developed layer of photosensitive resin and the revealed top planar conductive surface and, to fill the apertures of the first developed layer of photosensitive resin;
 f) irradiating the second photosensitive resin layer through a mask that matches a desired pattern cavity;
 g) developing the second photosensitive resin layer so as to hollow out apertures therein and to obtain a multi-level resin mould, the apertures in the multi-level mould formed by the developed first and second resin layers, revealing the top planar conductive surface of the substrate;
 h) galvanically depositing a metal or alloy in the apertures of the multi-level resin mould formed by the developed first and second resin layers;
 i) separating the substrate, then removing the first and second resin layers so as to reveal the multi-level metallic structure formed by the metal or alloy deposited in the apertures.

2. The method according to claim 1, wherein, after step b), the method includes the step of forming a partially opened conductive surface on the first photosensitive resin layer.

3. The method according to claim 1, wherein, after step c), the method includes the step of forming a partially opened conductive surface on the first layer of photosensitive resin.

4. The method according to claim 1, wherein, after step d), the method includes the step of forming a conductive surface on the remaining parts of the surface of resin layer developed in the preceding step.

5. The method according to claim 1, wherein, after step g), the method includes the step of forming a conductive surface at the bottom of the apertures.

6. The method according to claim 1, wherein once step g) is completed, steps e) to g) are repeated prior to passing to step h) so as to add an additional layer to the multi-level mould.

7. The method according to claim 1, wherein the conductive surfaces of the substrate are formed of a stack of chromium and gold layers.

8. The method according to claim 1, wherein, after step h), the method further includes a step that consists in flattening the deposited metal or alloy and the multi-level resin mould to make the multi-level resin mould and the deposited metal or alloy the same level.

9. The method according to claim 1, wherein the photosensitive resin deposited in step e) is a "solid" resin and it is applied by lamination.

* * * * *